(12) United States Patent
Gardner et al.

(10) Patent No.: US 6,847,057 B1
(45) Date of Patent: Jan. 25, 2005

(54) SEMICONDUCTOR LIGHT EMITTING DEVICES

(75) Inventors: Nathan F. Gardner, Mountain View, CA (US); Jonathan J. Wierer, Jr., Fremont, CA (US); Gerd O. Mueller, San Jose, CA (US); Michael R. Krames, Mountain View, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/633,058

(22) Filed: Aug. 1, 2003

(51) Int. Cl.$^7$ .............................................. H01L 33/00
(52) U.S. Cl. ...................................................... 257/99
(58) Field of Search ............................. 257/79, 80, 81, 257/86, 87, 94, 95, 96, 97, 101, 103, 106, 99, 110, 102; 372/45, 46, 50

(56) References Cited

U.S. PATENT DOCUMENTS

| | | | | |
|---|---|---|---|---|
| 4,169,997 A | | 10/1979 | Logan et al. ............... | 331/94.5 |
| 4,732,621 A | * | 3/1988 | Murata et al. ............... | 136/256 |
| 5,365,536 A | * | 11/1994 | Seki ........................... | 372/45 |
| 5,376,580 A | | 12/1994 | Kish et al. ................... | 437/127 |
| 5,452,316 A | | 9/1995 | Seki et al. .................. | 372/46 |
| 5,990,531 A | * | 11/1999 | Taskar et al. ................ | 257/410 |
| 6,122,103 A | | 9/2000 | Perkins et al. .............. | 359/486 |
| 6,288,840 B1 | | 9/2001 | Perkins et al. .............. | 359/486 |
| 6,309,953 B1 | * | 10/2001 | Fischer et al. .............. | 438/606 |
| 6,449,439 B1 | * | 9/2002 | Boyd et al. .................. | 396/374 |
| 6,486,499 B1 | | 11/2002 | Krames et al. ............... | 257/81 |
| 6,526,082 B1 | | 2/2003 | Corzine et al. ............... | 372/46 |
| 6,552,905 B2 | * | 4/2003 | Herring et al. .............. | 361/704 |
| 6,593,657 B1 | * | 7/2003 | Elliott et al. ................. | 257/765 |
| 6,642,618 B2 | * | 11/2003 | Yagi et al. ................... | 257/734 |

OTHER PUBLICATIONS

Tetsuya Takeuchi et al., "GaN–Based Light Emitting Diodes with Tunnel Junctions", The Japanese Society of Applied Physics, Jpn. J. Appl. Phys. vol. 40 (2001) Part 2, No. 8B, Aug. 15, 2001, pp. L861–L863.

Seong–Ran Jeon et al., "Lateral current spreading in GaN–based light–emitting diodes utilizing tunnel contact junctions", Applied Physics Letters, vol. 78, No. 21, May 21, 2001, pp. 3265–3267.

Xia Guo et al., "Tunnel–regenerated multiple–active–region light–emitting diodes with high efficiency", Applied Physics Letters, vol. 79, No. 18, Oct. 29, 2001, pp. 2985–2986.

Satoru Tanaka et al., "Anti–Surfactant in III–Nitride Epitaxy –Quantum Dot Formation and Dislocation Termination–", The Japan Society of Applied Physics, Jpn. J. Appl. Phys. vol. 39 (2000), Part 2, No. 8B, Aug. 15, 2000, pp. L831–834.

* cited by examiner

Primary Examiner—Long Pham
Assistant Examiner—Dana Farahani
(74) Attorney, Agent, or Firm—Patent Law Group LLP; Rachel V. Leiterman

(57) ABSTRACT

A III-nitride device includes a first n-type layer, a first p-type layer, and an active region separating the first p-type layer and the first n-type layer. The device may include a second n-type layer and a tunnel junction separating the first and second n-type layers. First and second contacts are electrically connected to the first and second n-type layers. The first and second contacts are formed from the same material, a material with a reflectivity to light emitted by the active region greater than 75%. The device may include a textured layer disposed between the second n-type layer and the second contact or formed on a surface of a growth substrate opposite the device layers.

50 Claims, 10 Drawing Sheets

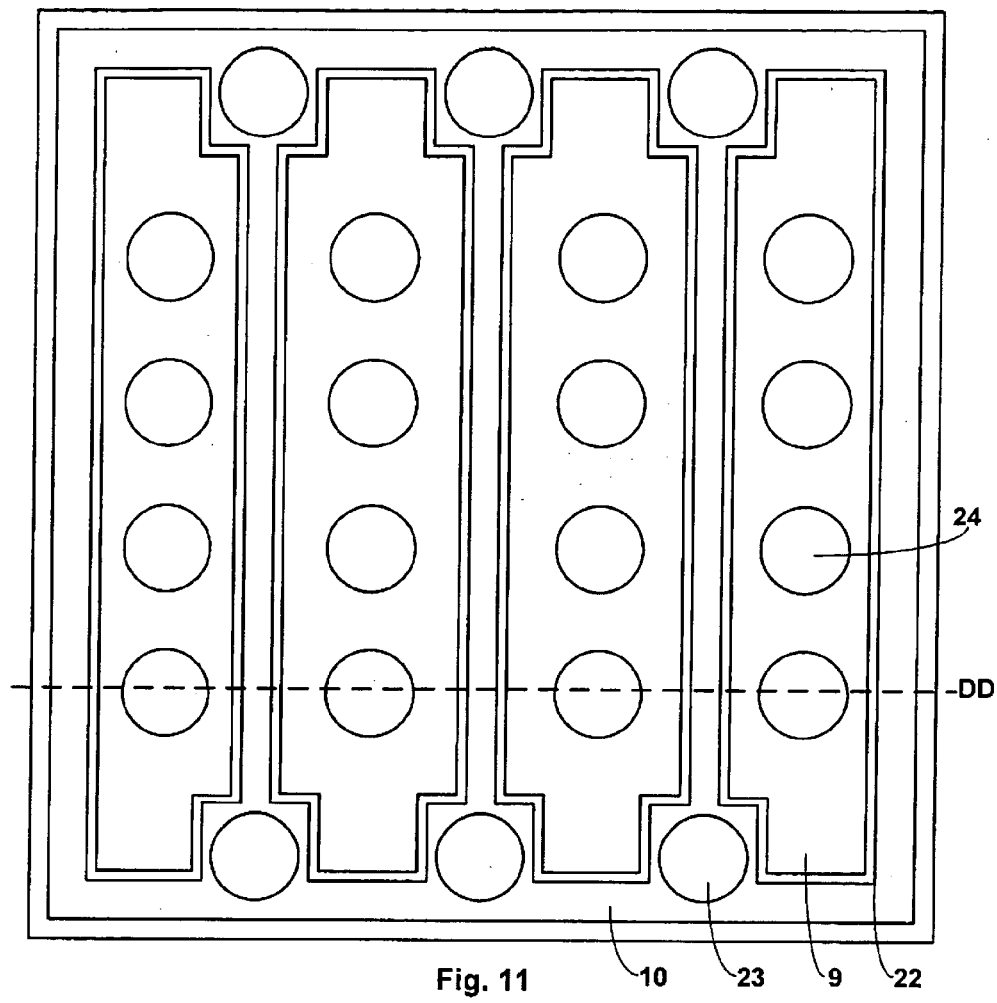
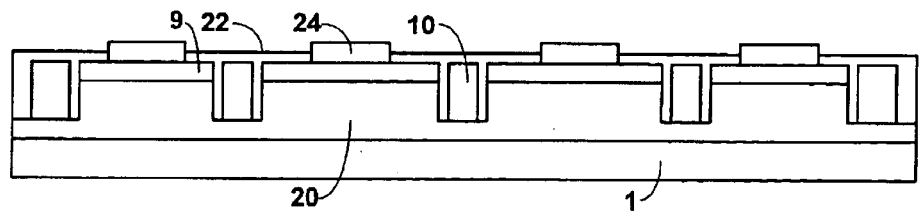
Fig. 11
Fig. 12

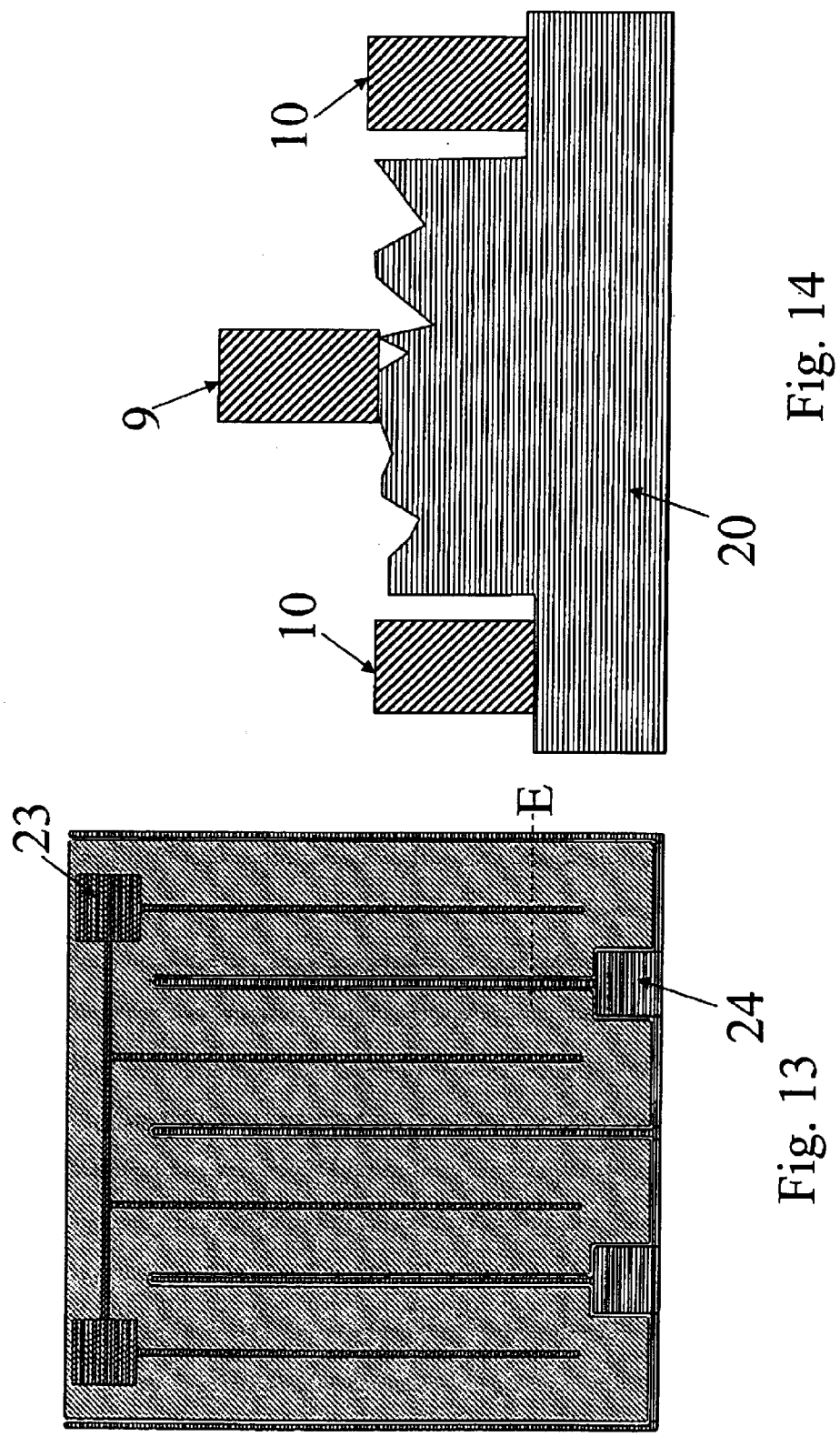

# SEMICONDUCTOR LIGHT EMITTING DEVICES

BACKGROUND

1. Field of Invention

This invention relates to semiconductor light emitting devices and, in particular, to III-nitride semiconductor light emitting devices incorporating tunnel junctions and scattering structures.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip chip device).

SUMMARY

In accordance with embodiments of the invention, a III-nitride device includes a first n-type layer, a first p-type layer, and an active region separating the first p-type layer and the first n-type layer. In some embodiments, the device includes a second n-type layer and a tunnel junction separating the first and second n-type layers. First and second contacts are electrically connected to the first and second n-type layers. The first and second contacts are formed from the same material, a material with a reflectivity to light emitted by the active region of at least 75%. In some embodiments, the device includes a textured layer. In devices including both a textured layer and a tunnel junction, the textured layer may be disposed between the second n-type layer and the second contact. In devices lacking a tunnel junction, the device may include a substrate, and the textured layer may be formed on a surface of the substrate opposite the device layers.

DESCRIPTION OF THE DRAWINGS

FIGS. 11 and 12 illustrate a plan view and a cross sectional view of a large junction light emitting device.

FIGS. 13 and 14 illustrate a plan view and a cross sectional view of a top emitting light emitting device.

DETAILED DESCRIPTION

Figure 1:
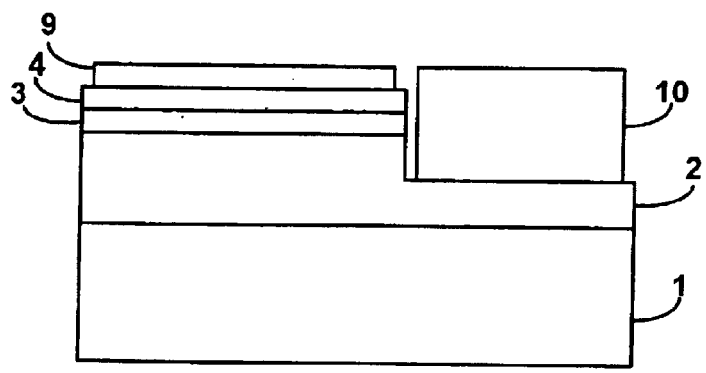
FIG. 1 illustrates a III-nitride flip chip light emitting device.

FIG. 1 illustrates an example of a III-nitride flip chip device including a sapphire substrate 1, an n-type region 2, an active region 3, and a p-type region 4. A portion of the p-type region and active region are etched away to expose a part of n-type region 2. An n-contact 10 is formed on the exposed part of n-type region 2. A p-contact 9 is formed on the remaining part of p-type region 4.

Several factors limit the amount of light that can be produced and usefully extracted by the device of FIG. 1.

First, the use of a silver p-contact limits the maximum junction temperature at which the device of FIG. 1 may operate. The contact area of the p-contact is generally larger than that of the n-contact, in order to maximize the light emitting area of the device since formation of the n-contact requires etching away a portion of the active region. Contacts 9 and 10 are selected for low contact resistivity, in order to minimize the voltage that must be applied to the device, and for high reflectivity, in order to reflect light incident on the contacts back into the device so it may be extracted through the substrate 1 of the flip chip of FIG. 1. Since the p-contact is generally larger than the n-contact, it is particularly important that the p-contact be highly reflective. The combination of high reflectivity and low contact resistivity has been difficult to achieve for the p-contact of III-nitride devices such as the device illustrated in FIG. 1. For example, aluminum is reasonably reflective but does not make good ohmic contact to p-type III-nitride materials. Silver is often used because it makes a good p-type ohmic contact and is very reflective, but silver suffers from poor adhesion to III-nitride layers and from susceptibility to electro-migration which can lead to catastrophic device failure. In order to avoid the problem of electro-migration in a silver contact, the contact may be protected by one or more layers of metal. To increase the light output of a device, the current through the device must be increased. As the current increases, the operating temperature of the device increases. At temperatures greater than 250° C., the difference in the coefficient of thermal expansion between the protective layer over the silver p-contact and the silver p-contact itself can cause the p-contact to delaminate from the semiconductor layers of the device, resulting in unacceptably high forward voltage and non-uniform light output. This limits the maximum current density and ultimately the light output of the device.

Second, the high index of refraction of III-nitride layers (n ~2.4) create several interfaces with a large contrast in index of refraction; for example, the interface between the sapphire substrate (n ~1.8) and the III-nitride layers. Interfaces with large contrasts in index of refraction tend to trap light inside the device.

In accordance with embodiments of the invention, structures are provided that may increase the maximum operating temperature of the device and interrupt interfaces which trap light in the device, thereby potentially increasing the amount of light generated in and usefully extracted from the device. The examples described below are III-nitride light emitting devices. The semiconductor layers of III-nitride devices have the general formula $Al_xIn_yGa_zN$, where $0 \leq x \leq 1$, $0 \leq y0$, $1 \leq z \leq 1$, $x+y+z=1$. III-nitride device layers may further contain group III elements such as boron and thallium and may have some of the nitrogen may be replaced by phosphorus, arsenic, antimony, or bismuth. Though the examples below describe III-nitride devices, embodiments of the invention may also be fabricated in other III-V materials systems including III-phosphide and III-arsenide, II-VI material systems, and any other materials systems suitable for making light emitting devices.

Figure 2:
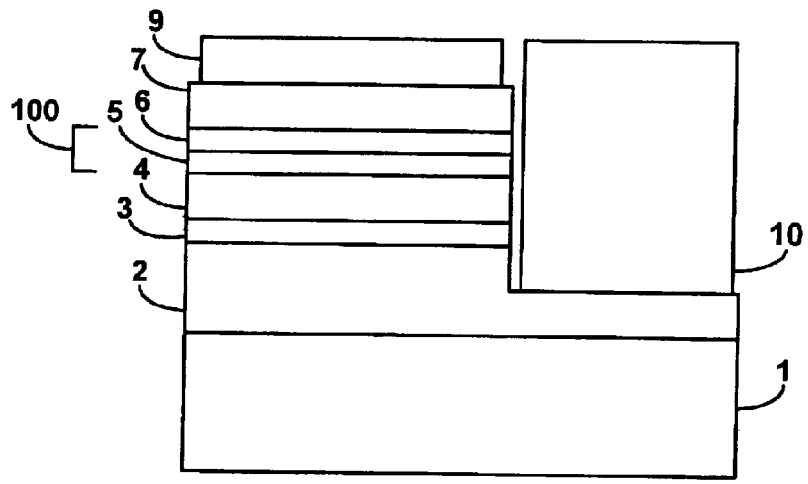
FIGS. 2 and 3 illustrate devices including tunnel junctions.
Figure 3:
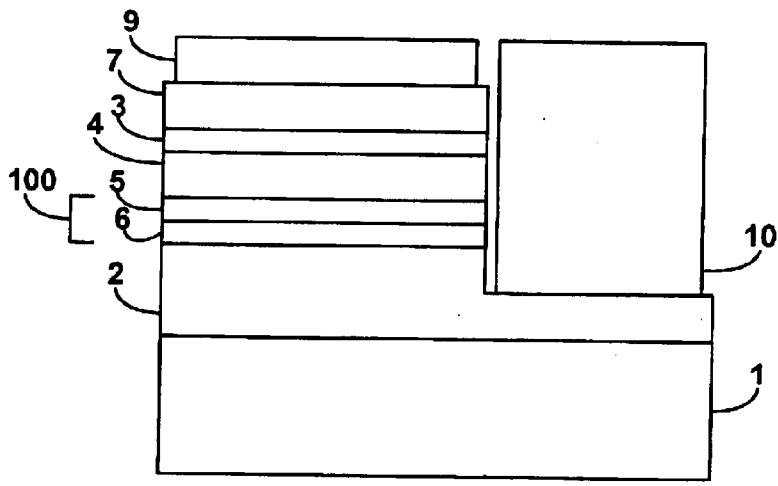

FIGS. 2 and 3 illustrate a first embodiment of the invention. In the device of FIG. 2, after the formation of n-type region 2, active region 3, and p-type region 4 on a suitable substrate 1, a tunnel junction 100 is formed, then another n-type layer 7. FIG. 3 illustrates an alternative implementation of a device incorporating a tunnel junction. Tunnel junction 100 of FIG. 3 is located beneath the active region, rather than above the active region as in the implementation shown in FIG. 2. Tunnel junction 100 of FIG. 3 is located between n-type layer 2 and p-type layer 4. Thus, the polarity of the device in FIG. 3 is the opposite of the polarity of the device in FIG. 2. Tunnel junction 100 allows for a conductivity change in the material grown above the tunnel junction as compared to the material below.

Tunnel junction 100 includes a heavily doped p-type layer 5, also referred to as a p++ layer, and a heavily doped n-type layer 6, also referred to as an n++ layer. P++ layer 5 may be, for example, InGaN or GaN for a blue-emitting device or AlInGaN or AlGaN for a UV-emitting device, doped with an acceptor such as Mg or Zn to a concentration of about $10^{18}$ cm$^{-3}$ to about $5 \times 10^{20}$ cm$^{-3}$. In some embodiments, p++ layer 5 is doped to a concentration of about $2 \times 10^{20}$ cm$^{-3}$ to about $4 \times 10^{20}$ cm$^{-3}$. N++ layer 6 may be, for example, InGaN or GaN for a blue-emitting device or AlInGaN or AlGaN for a UV-emitting device, doped with a donor such as Si, Ge, Se, or Te to a concentration of about $10^{18}$ cm$^{-3}$ to about $5 \times 10^{21}$ cm$^{-3}$. In some embodiments, n++ layer 6 is doped to a concentration of about $7 \times 10^{19}$ cm$^{-3}$ to about $9 \times 10^{19}$ cm$^{-3}$. Tunnel junction 100 is usually very thin, for example tunnel junction 100 may have a total thickness ranging from about 2 nm to about 100 nm, and each of p++ layer 5 and n++ layer 6 may have a thickness ranging from about 1 nm to about 50 nm. In some embodiments, each of p++ layer 5 and n++ layer 6 may have a thickness ranging from about 25 nm to about 35 nm. P++ layer 5 and n++ layer 6 may not necessarily be the same thickness. In one embodiment, p++ layer 5 is 15 nm of Mg-doped InGaN and n++ layer 6 is 30 nm of Si-doped GaN. P++ layer 5 and n++ layer 6 may have a graded dopant concentration. For example, a portion of p++ layer 5 adjacent to the underlying p-layer 4 may have a dopant concentration that is graded from the dopant concentration of the underlying p-type layer to the desired dopant concentration in p++ layer 5. Similarly, n++ layer 6 may have a dopant concentration that is graded from a maximum adjacent to p++ layer 5 to a minimum adjacent to n-type layer 7. Tunnel junction 100 is fabricated to be thin enough and doped enough such that tunnel junction 100 is near ohmic when reverse-biased, i.e. tunnel junction 100 displays low series voltage drop and low resistance when conducting current in reverse-biased mode. In some embodiments, the voltage drop across tunnel junction 100 when reverse-biased is about 0.1 V to about 1 V at current densities of 200 A/cm$^2$.

Tunnel junction 100 is fabricated such that when a voltage is applied across contacts 9 and 10 such that the p-n junction between active region 3 and p-type layer 4 is forward biased, tunnel junction 100 quickly breaks down and conducts in the reverse-bias direction with a minimal voltage drop. Each of the layers in tunnel junction 100 need not have the same composition, thickness, or dopant composition. Tunnel junction 100 may also include an additional layer between p++ layer 5 and n++ layer 6 that contains both p- and n-type dopants.

Figure 6:
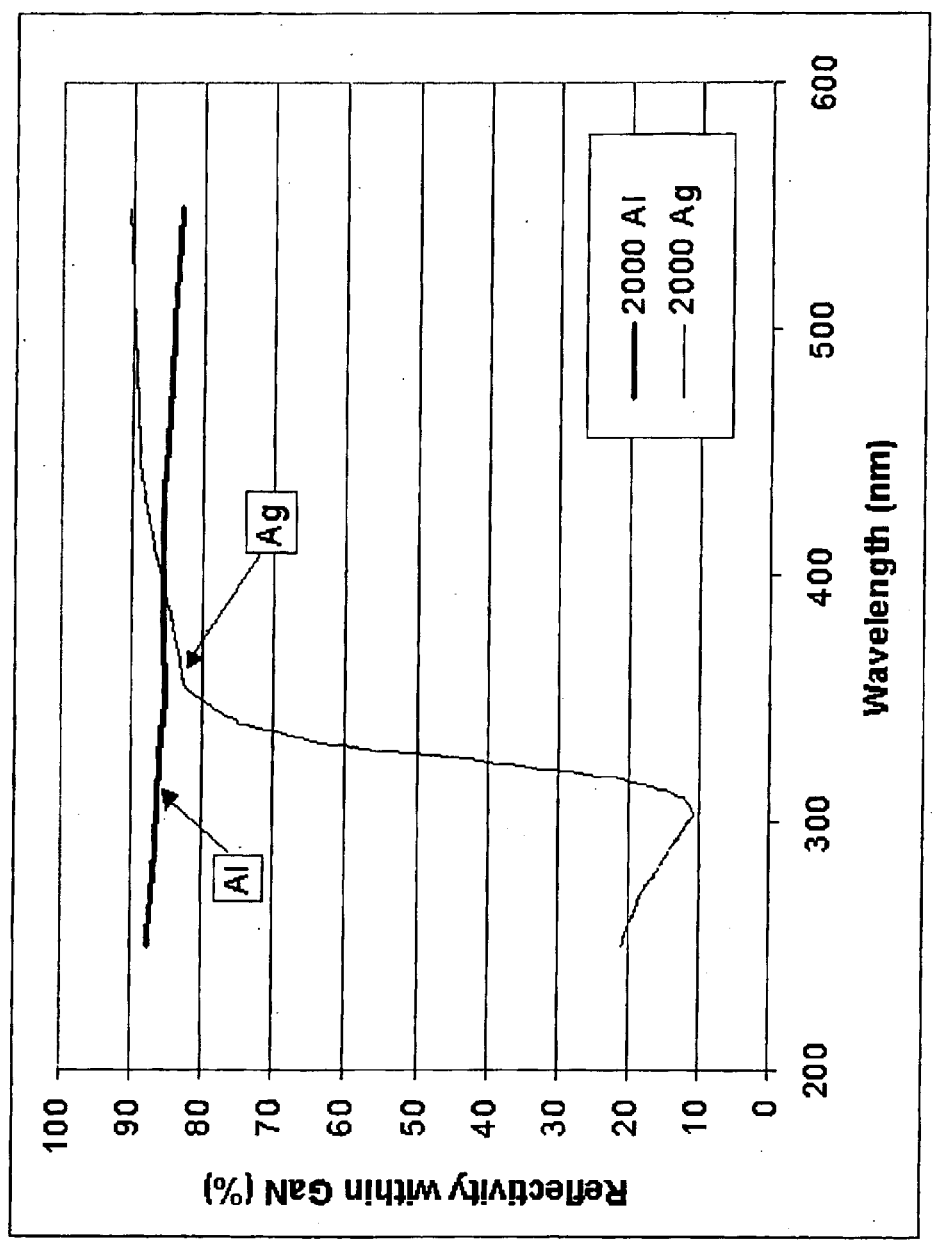
FIG. 6 is a plot of the calculated reflectivity of aluminum and silver as a function of wavelength.

A light emitting device incorporating a tunnel junction permits the use of two n-contacts rather than different n- and p-contacts, since both contacts are formed on n-type layers, layers 2 and 7. The use of two n-contacts eliminates the silver p-contact described above and resulting limitation on maximum operating temperature. Any n-contact with a reflectivity to light emitted by the active region greater than 75% may be used in a flip chip device. An example of a suitable n-contact is aluminum. Aluminum makes low resistance contact to both etched and unetched n-type III-nitride. FIG. 6 illustrates the calculated reflectivity of aluminum vs. silver at wavelengths between 250 and 550 nm. FIG. 6 demonstrates that aluminum has high reflectivity over the illustrated range, and is more reflective than silver in UV wavelengths. Since both contacts may be the same material, some deposition and etching steps required to deposit different contact materials on the p- and n-regions of the device may potentially be eliminated.

Tunnel junction 100 also acts as a hole spreading layer to distribute positive charge carriers in p-type layer 4. Carriers in n-type III-nitride material have a much longer diffusion length than carriers in p-type III-nitride material, thus current can spread more readily in an n-type layer than a p-type layer. Since current spreading on the p-side of the p-n junction occurs in n-type layer 7, the devices illustrated in FIGS. 2 and 3 may have better p-side current spreading than a device lacking a tunnel junction.

Figure 4:
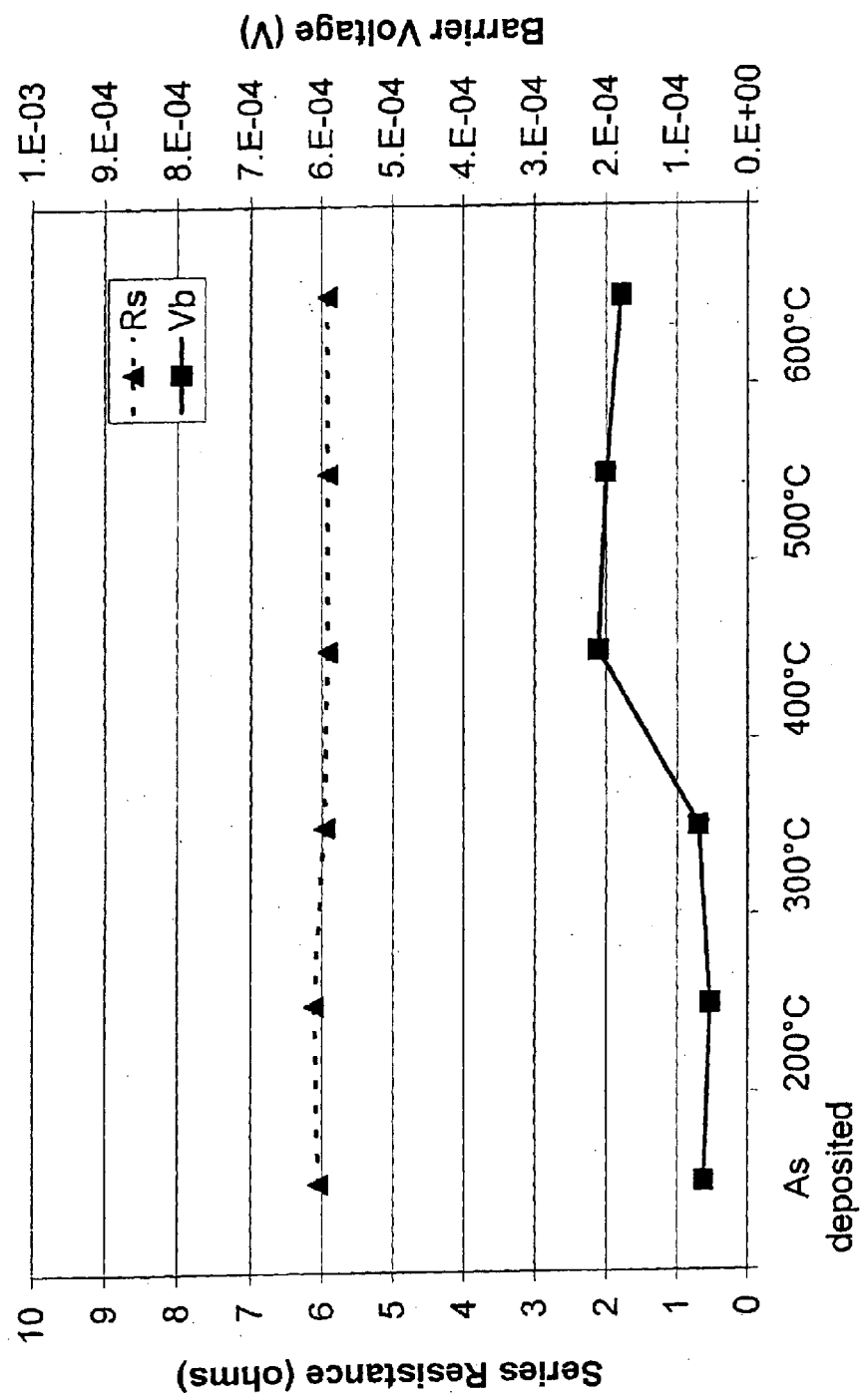
FIG. 4 is a plot of series resistance and barrier voltage vs. temperature for two displaced Al contacts on n-GaN.

FIG. 4 illustrates the performance of a test device with aluminum contacts. Current vs. voltage measurements were taken between two contacts both deposited on the same n-layer, and the resistance and barrier voltage (the smallest voltage necessary to pass non-zero current) were recorded. As illustrated in FIG. 4, there is little change in both the resistance and the barrier voltage as temperature increases to 600° C., indicating a stable contact.

Figure 5:
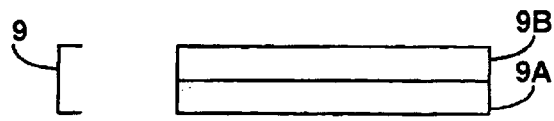
FIG. 5 illustrates a multilayer contact.

The contacts illustrated in FIGS. 2 and 3 may be single or multilayer contacts. Single layer contacts may have a thickness ranging between about 0.5 and about 5 microns. An example of a multilayer contact is illustrated in FIG. 5. The contact 9 illustrated in FIG. 5 has two layers, an aluminum layer 9A between about 750 Å and about 5000 Å thick that provides a high quality reflector, and an aluminum alloy layer 9B between about 0.5 microns and about 5 microns thick. Alloy layer 9B prevents electro-migration of the aluminum in layer 9A at high current density. The elements in alloy layer 9B other than aluminum may be present in small amounts just large enough to fill in grain boundaries in the aluminum, for example, less than 5%. Examples of suitable alloys are Al—Si, Al—Si—Ti, Al—Cu, and Al—Cu—W. The composition of layers 9A and 9B may be selected to have similar coefficients of thermal expansion to avoid stress-related delamination at elevated temperatures.

Figure 7A:
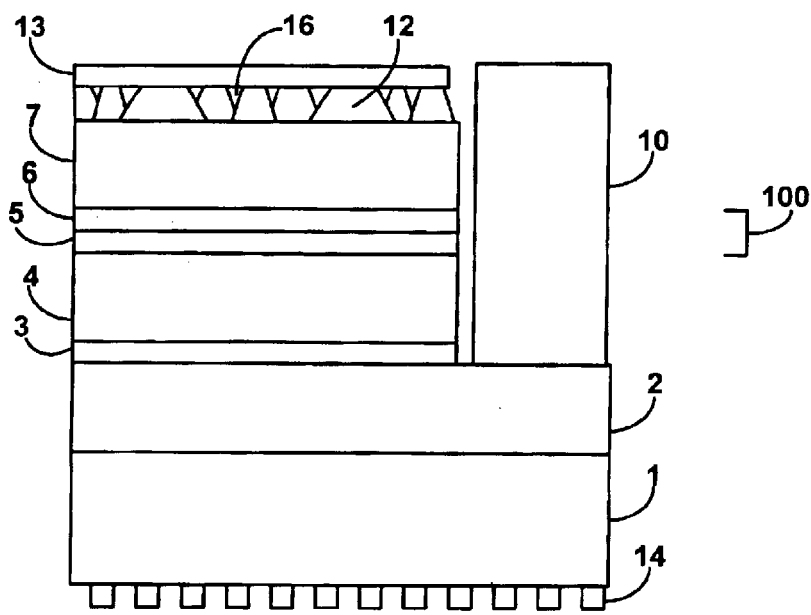
FIGS. 7A, 7B, and 8 illustrate devices including scattering structures.
Figure 7B:
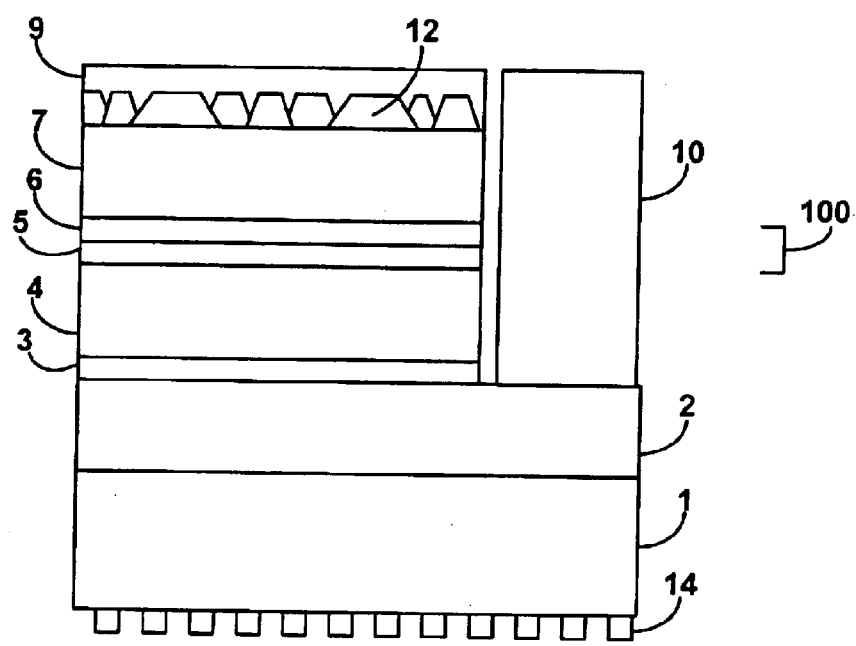

FIGS. 7A and 7B illustrate embodiments of a device including a textured layer to improve the extraction of photons from the device. Textured layer 12 is formed over second n-type layer 7. Since the textured layer is typically of the same conductivity type as the nearest underlying layer, in the embodiment illustrated in FIGS. 7A and 7B, textured layer 12 is an n-type layer, though in other embodiments a p-type layer may be textured. Textured layer 12 may be composed of any III-N semiconductor, although it is often GaN or a composition of AlInGaN that is transparent to the light emitted by the active region. Textured layer 12 interrupts the smooth surface of the III-nitride layers and scatters light out of the device. Textured layer 12 may be formed by several techniques known in the art. For example, a textured layer may be formed by depositing a $SiN_x$ "nanomask," that is, a thin layer of $SiN_x$ of varying coverage, on the device prior to growth of the textured layer. The presence of Si on the device changes the growth mode of subsequently grown GaN from two dimensional to three dimensional, resulting in a textured surface. The characteristics of the textured layer can be adjusted by varying the thickness of the nanomask and by the growth conditions used to deposit GaN on top of the nanomask, and is known in the art.

In the embodiment illustrated in FIG. 7A, textured layer 12 includes pyramids or pillars of semiconductor material separated by pockets 16 which may be filled with air or another material with a low index of refraction as compared to III-nitride materials. For example, a low index of refraction material may have an index of refraction less than about 2. Layer 12 may have a thickness of about 200 Å to about 10,000 Å, usually between about 500 Å and about 4000 Å. The ratio of pockets to material may vary from about 10% of the volume of layer 12 as pockets, up to about 90% of the volume of layer 12 as pockets, with the volume of layer 12 as pockets usually between about 50% and about 90%.

In the embodiments illustrated in FIGS. 7A and 7B, a contact is formed over textured layer 12. Contact 9 may be deposited on textured layer 12 by, for example, evaporation or sputtering, to form a conformal layer over textured layer 12, as illustrated in FIG. 7B. In the embodiment illustrated in FIG. 7A, a material with a low index of refraction may be deposited over textured layer 12 in pockets 16 as a thick layer, then patterned to open holes in the low index material down to the textured layer 12. Contact 13 may then be deposited by, for example, evaporation or sputtering. Alternatively, contact 13 of FIG. 7A may be a smooth metal mirror that is bonded to textured layer 12, trapping air in pockets 16. Mirror 13 may be formed by depositing a film of reflective metal on a host substrate with thermal properties similar to the device, such as, for example, GaN, GaAs, $Al_2O_3$, Cu, Mo, or Si. The mirror/host substrate combination is then bonded, at elevated temperature (for example, between about 200° C. and about 1,000° C.) and pressure (for example, between about 50 psi and about 500 psi), to a cleaned surface of the LED wafer such that the metal mirror faces the textured surface of the LED wafer. Thin metal layers or layers of a transparent material such as indium tin oxide may be deposited on the textured surface prior to bonding. Also, the air pockets in textured layer 12 may be filled with a low-index-of-refraction dielectric, such as MgF, prior to bonding of the mirror. The mirror material and the bonding method are selected such that the forward voltage of the device is not substantially affected by mirror 13.

An optional polarization selection layer 14 that polarizes the photons emitted by the active region, such as a wire grid polarizer, may be formed on a side of the substrate opposite the device layers. Wire grid polarizers are explained in more detail in U.S. Pat. Nos. 6,122,103 and 6,288,840, both of which are incorporated herein by reference. Wire grid polarizers reflect photons of a polarization that is parallel to the wires, and transmit photons of a polarization that is perpendicular to the wires. If a photon is emitted from the active region and has a polarization that causes it to be reflected from the wire grid polarizer, it will propagate towards the textured surface. Upon reflecting from the textured surface, the direction of polarization of the photon will be changed, possibly allowing the photon to pass through the polarizer. The light emitted outside the device, then, will be linearly polarized. The combination of the wire grid polarizer and reflecting textured surface recycles photons until they achieve a certain polarization. Polarization selection layer 14 may be formed at any stage of the processing, and is often formed as the last processing step, prior to singulating the dice from the wafer. A wire grid polarizer may be formed by the following method: a layer of metal is deposited on the wafer, followed by a layer of photoresist over the metal. The photoresist is patterned by exposing it to radiation, for example by shining short-wavelength light through a photomask with the wire-grid polarizer pattern already formed on it, by using the interference pattern from two laser beams to project an array of lines of light of varying intensity onto the photoresist, or by drawing the wire-grid polarizer pattern on the photoresist with an electron beam. Once the photoresist is exposed, it is developed and rinsed, resulting in lines of photoresist remaining on the metal layer. The metal layer is etched by chemicals (wet etching), a reactive ion beam (RIE), a plasma-enhanced reactive ion beam, an inductively-coupled plasma (ICP), or other appropriate technique known in the art. The remaining photoresist is then chemically stripped from the wafer, resulting in a pattern of metal lines remaining on the wafer. The periodicity of wires in a wire grid polarizer may be optimized for the wavelength of emission of the device, resulting in very high reflecting efficiency.

Tunnel junction devices incorporating any of scattering layer 12, bonded metal layer 13, and polarizing grid 14 may also be formed in a device with the polarity reversed from the devices shown in FIGS. 7A and 7B, as illustrated in FIG. 3.

Growth of a textured layer on a device with a tunnel junction may offer several advantages. The tunnel junction in the device of FIGS. 7A and 7B permits growth of textured layer 12 on an n-type layer. Texturing p-type III-nitride layers has several disadvantages. First, scattering layers etched into p-type nitride layers generally do not provide a surface suitable for electrical contact. Contacts formed on such scattering layers often add significantly to the forward voltage of the device and exhibit poor reliability. Also, the formation of a p-type textured layer on a p-type layer by a $SiN_x$ nanomask is problematic because the presence of the donor Si in the nanomask is likely to result in the formation of a p-n junction, which will increase the forward bias voltage of the LED. Further, the pockets in a p-type textured layer would undesirably reduce the amount of p-type material available for current spreading. Formation of a textured layer on n-type layer 7 may eliminate the above-described electrical and reliability problems of textured layers formed on p-type III-nitride layers.

The tunnel junction of FIGS. 7A and 7B also allows the textured layer to be located above the active region of the device, permitting growth of the active region before growth of the textured layer. Since the dislocation density of textured III-nitride layers tends to be greater than the dislocation density in a smooth III-nitride layer, it is difficult to grow a high-quality active region on a textured surface. The use of a tunnel junction avoids both texturing a p-type region and texturing a region grown before the active region.

Bonding a mirror 13 to a textured layer 12 also may improve the light extraction in the device. Bonding a flat mirror onto textured layer 12 produces air pockets 16 between the mirror and the scattering layer. These air pockets also function as scattering centers. Such air pockets may not be formed if the contact is deposited by traditional techniques such as sputtering, evaporation, or electroplating, rather than by bonding.

The use of textured layer 12 with polarization selection layer 14 where polarization is desired may eliminate some inefficiencies associated with traditional polarizers, which function by absorbing light of the incorrect polarization. Textured layer 12 acts as a polarization randomizer. When photons of undesirable polarization reflect off polarization selection layer 14, they may reflect again off textured layer 12 which changes the polarization direction of the photons. After one or more reflections between polarization selection layer 14 and textured layer 12, the photons may acquire the correct polarization to pass through the polarizer. Thus, photons which are emitted from the active region with an incorrect polarization can eventually acquire the correct polarization. In the case where an external absorbing polarizer is used, photons with initially incorrect polarization are absorbed and therefore lost. In the case where no textured layer is present, there will be little randomization of the polarization direction of the reflected, incorrectly polarized light. Therefore this light will reflect back and forth inside the LED until it is ultimately absorbed and lost.

Figure 8:
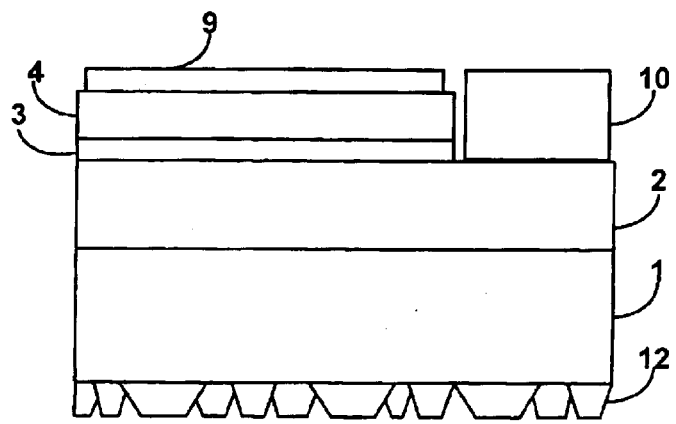

FIG. 8 illustrates an alternative embodiment of a device including a textured structure to improve the extraction of photons from the device. Textured structure 12 is formed on the back of substrate 1, opposite the device layers. In this embodiment, the substrate must have a refractive index substantially higher than the ambient medium, so that most light from the active region interacts with the textured surface. The refractive index of the substrate should be greater than 1.8. Therefore, substrate 1 is typically SiC (n ~2.5). The device illustrated in FIG. 8 does not require a tunnel junction. Textured structure 12 may be, for example, a rough n-type GaN layer. Both p- and n-contacts are formed on the side of the substrate opposite the texturing. The textured layer may be deposited by epitaxial growth prior to growth of the LED device layers on the opposing side of the substrate. The characteristic features of the texturing are identical to those described above in reference to FIGS. 7A and 7B.

Figure 9:
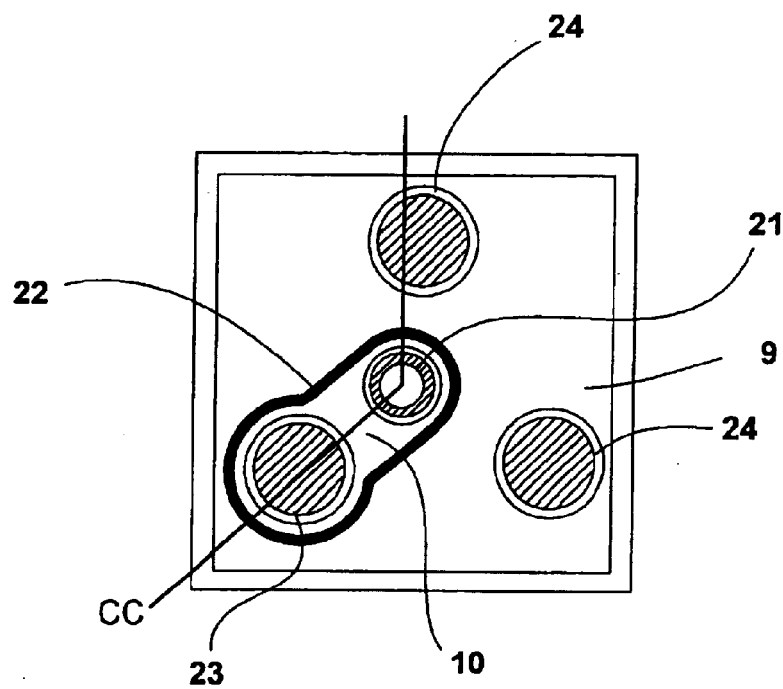
FIGS. 9 and 10 illustrate a plan view and a cross sectional view of a small junction light emitting device.
Figure 10:
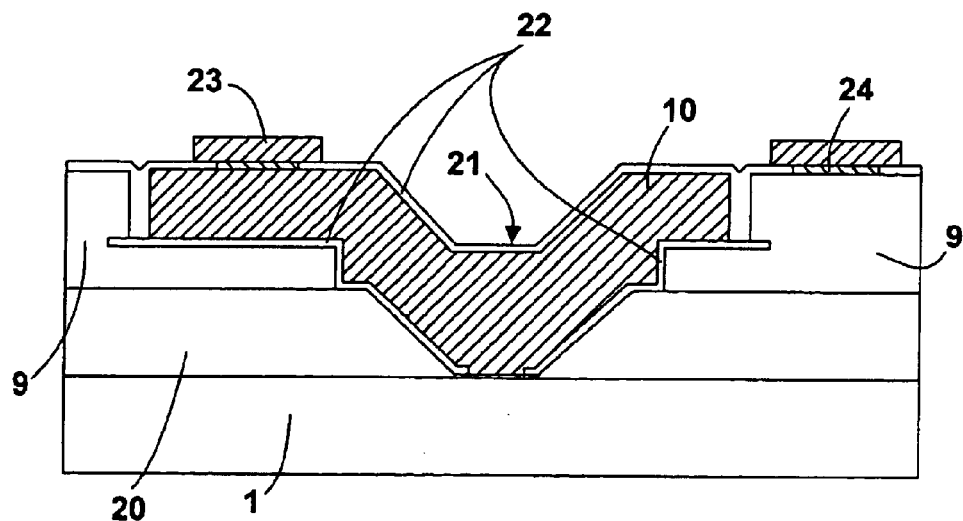

FIG. 9 is a plan view of a small junction device (i.e. an area less than one square millimeter). FIG. 10 is a cross section of the device shown in FIG. 9, taken along axis CC. FIGS. 9 and 10 illustrate an arrangement of contacts that may be used with any of the epitaxial structures 20 illustrated in FIGS. 2, 3, 7A, 7B and 8. The device shown in FIGS. 9 and 10 has a single via 21 etched down to an n-type layer of epitaxial structure 20 below the active region. An n-contact 10 is deposited in via 21. N-via 21 is located at the center of the device to provide uniformity of current and light emission. A p-contact 9 provides electrical contact to the p-side of the active region of epitaxial structure 20. In embodiments with a tunnel junction, p-contact 9 may be formed on an n-type layer and may be the same structure and material as n-contact 10. In other embodiments, p-contact 9 may be formed on a p-type layer and may be a bonded layer 13 as illustrated in FIG. 7A. In still other embodiments, p-contact 9 includes an optional guard metal layer (not shown) covering a thin p-contact, and a thick p-metal layer deposited over the guard metal layer. N-contact 10 is separated from the p-contact 9 by one or more dielectric layers 22. A p-submount connection 24, for example, a wettable metal for connecting to solder, connects to p-contact 9 and an n-submount connection 23 connects to n-contact 10.

As illustrated in FIG. 9, the device is connected to a submount by three submount connections, two p-submount connections 24 and one n-submount connection 23. N-submount connection 23 may be located anywhere within n-contact region 10 (surrounded by insulating layer 22) and need not be located directly over via 21. Similarly, p-submount connections 24 may be located anywhere on p-contact 9. As a result, the connection of the device to a submount is not limited by the shape or placement of p-contact 9 and n-contact 10.

FIG. 11 is a plan view of a large junction device (i.e. an area greater than or equal to one square millimeter). FIG. 12 is a cross section of the device shown in FIG. 11, taken along axis DD. FIGS. 11 and 12 also illustrate an arrangement of contacts that may be used with any of the epitaxial structures 20 illustrated in FIGS. 2, 3, 7A, 7B, and 8. The active region of epitaxial structure 20 is separated into four regions separated by three trenches in which n-contacts 10 are formed. Each region is connected to a submount by four p-submount connections 24 formed on p-contact 9. As described above, in devices including a tunnel junction, p-contact 9 may be formed on an n-type layer and may be the same structure and materials as n-contact 10. In other embodiments, p-contact 9 may be formed on a p-type layer and may have a structure or material different from n-contact 10, or p-contact 9 may be a bonded layer 13 as illustrated in FIG. 7A. N-contact 10 surrounds the four active regions. N-contact 10 is connected to a submount by six n-submount connections 23. The n- and p-contacts may be electrically isolated by an insulating layer 22.

The devices illustrated in FIGS. 9–12 are typically mounted in flip chip configuration, such that most of the light exiting the device exits through the growth substrate 1. FIGS. 13 and 14 illustrate a top emitting device, where most of the light exiting the device exits through the top surface of the epitaxial layers, the same surface on which the contacts are formed. FIG. 13 is a plan view of the top emitting device. FIG. 14 is a cross sectional view of a portion of FIG. 13, along axis E. Though FIG. 14 shows a textured top epitaxial layer, epitaxial layers 20 may be any of the epitaxial structures shown in FIGS. 2, 3, 7A, 7B and 8. Fingers of p-contact 9 interpose fingers of n-contact 10. The area covered by contacts 9 and 10 may be minimized if contacts 9 and 10 are formed from a material that is absorbing to light emitted by the active region of the device. The device may be wire bonded to the leads of a package.

Figure 16:
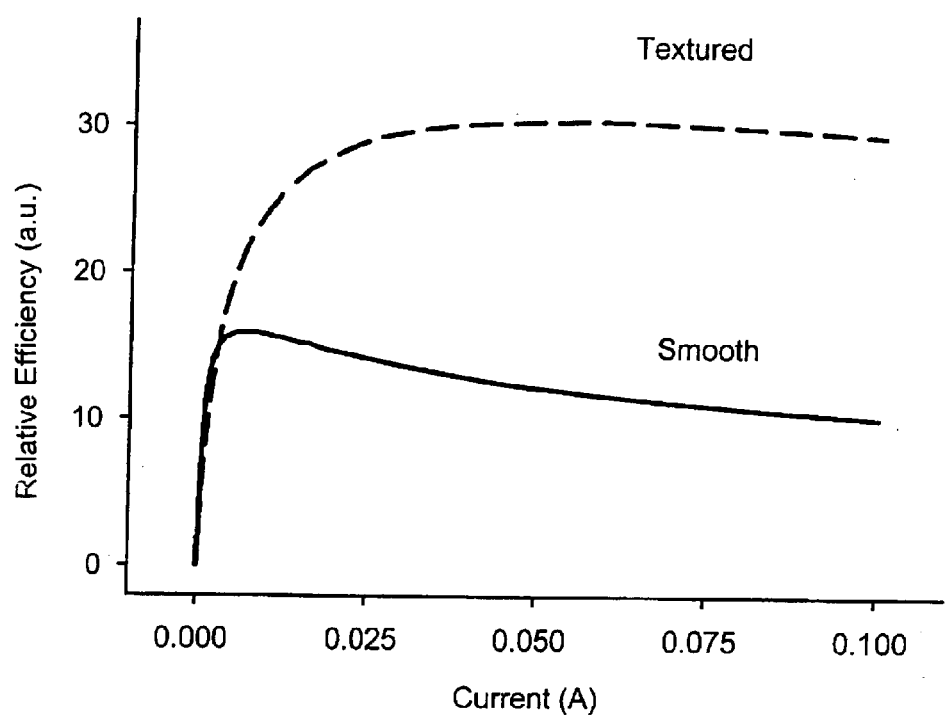
FIG. 16 illustrates external quantum efficiency as a function of current for two devices according to FIGS. 13 and 14, one with a textured layer and one without a textured layer.

FIG. 16 illustrates the relative external quantum efficiency (a.u.) as a function of current for two devices like the device illustrated in FIGS. 13 and 14, one with a textured layer formed over a tunnel junction and one with a tunnel junction but no textured layer. The dashed line in FIG. 16 represents the device with a textured layer and the solid line represents the device without a textured layer. As illustrated in FIG. 16, the device including a textured layer has a higher external quantum efficiency than the device without the textured layer, indicating that the textured layer contributes to the amount of light extracted from the device.

Figure 15:
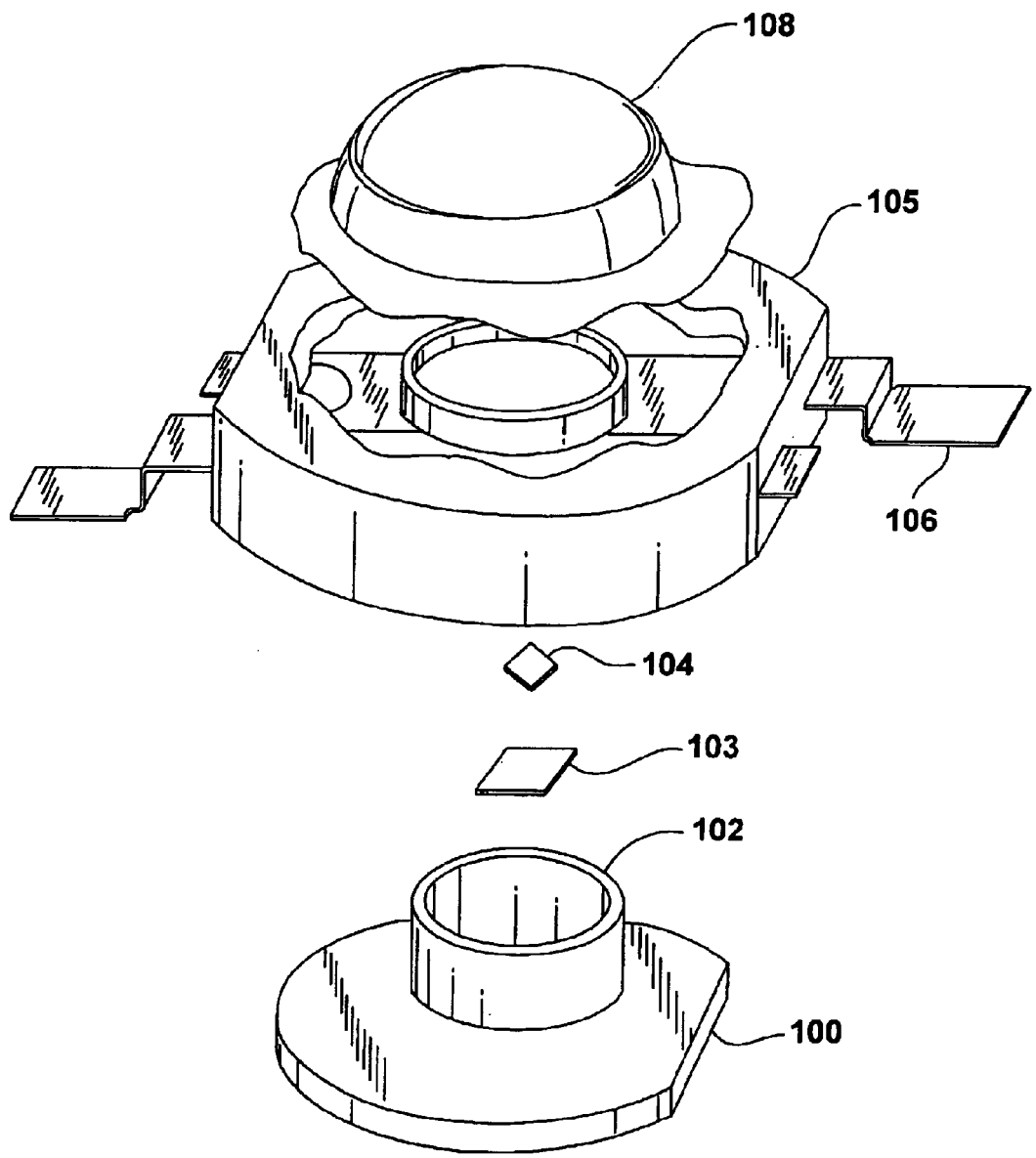
FIG. 15 illustrates a packaged light emitting device.

FIG. 15 is an exploded view of a packaged light emitting device. A heat-sinking slug 100 is placed into an insert-molded leadframe 106. The insert-molded leadframe 106 is, for example, a filled plastic material molded around a metal frame that provides an electrical path. Slug 100 may include an optional reflector cup 102. The light emitting device die 104, which may be any of the devices described above, is mounted directly or indirectly via a thermally conducting submount 103 to slug 100. An optical lens 108 may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A III-nitride light emitting device comprising:
    a first layer of first conductive type;
    a first layer of second conductive type;
    an active region;
    a tunnel junction, the tunnel junction comprising:
        a second layer of first conductivity type having a dopant concentration greater than the first layer of first conductivity type; and
        a second layer of second conductivity type having a dopant concentration greater than the first layer of second conductivity type;
    a third layer of first conductivity type;
    a first contact electrically connected to the first layer of first conductivity type; and
    a second contact electrically connected to the third layer of first conductivity type;
    wherein
        the first and second contacts comprise the comprise the same material;
        the first and second contact material has a reflectivity to light emitted by the active region greater than 75%;
        the active region is disposed between a layer of first conductivity type and a layer of second conductivity type; and
        the tunnel junction is disposed between the first layer of first conductive type and the third layer of first conductivity type.

2. The device of claim 1 wherein:
    the second layer of first conductivity type has a dopant concentration ranging from about $10^{18}$ cm$^{-3}$ to about $5\times10^{20}$; and
    the second layer of second conductivity type has a dopant concentration ranging from about $10^{18}$ cm$^{-3}$ to about $5\times10^{20}$.

3. The device of claim 1 wherein the second layer of first conductivity type has a dopant concentration ranging from about $2\times10^{20}$ cm$^{-3}$ to about $4\times10^{20}$ cm$^{-3}$.

4. The device of claim 1 wherein the second layer of second conductivity type has a dopant concentration from about $7\times10^{19}$ cm$^{-3}$ to about $9\times10^{19}$ cm$^{-3}$.

5. The device of claim 1 wherein the tunnel junction has a voltage drop ranging from between about 0 V to about 1 V when operated in reverse-biased mode.

6. The device of claim 1 wherein the tunnel junction has a voltage drop ranging from between about 0.1 V to about 1 V when operated in reverse-biased mode.

7. The device of claim 1 wherein:
    the second layer of first conductivity type has a thickness ranging from about 1 nm to about 50 nm; and
    the second layer of second conductivity type has a thickness ranging from about 1 mm to about 50 nm.

8. The device of claim 1 wherein the tunnel junction has a thickness ranging from about 2 nm to about 100 nm.

9. The device of claim 1 further comprising a textured layer disposed between the third layer of first conductivity type and the second contact.

10. The device of claim 9 wherein the textured layer comprises islands of semiconductor material and pockets between the islands.

11. The device of claim 10 wherein the islands of semiconductor material comprise about 10% to about 90% of a volume of the textured layer.

12. The device of claim 10 wherein the islands of semiconductor material comprise about 10% to about 50% of a volume of the textured layer.

13. The device of claim 10 wherein the pockets are filled with air.

14. The device of claim 10 wherein the pockets are at least partially filled with a material having an index of refraction less than about 2.

15. The device of claim 10 wherein the second contact is formed over the textured layer and fills the pockets.

16. The device of claim 9 wherein the textured layer has a thickness between about 200 Å and about 10,000 Å.

17. The device of claim 9 wherein the textured layer has a thickness between about 500 Å and about 4000 Å.

18. The device of claim 9 wherein the second contact is bonded to the textured layer.

19. The device of claim 18 further comprising at least one void disposed between the textured layer and the second contact.

20. The device of claim 1 further comprising:
    a submount;
    a first interconnect connecting the first contact to the submount; and
    a second interconnect connecting the second contact to the submount.

21. The device of claim 20 further comprising:
    a plurality of lead connected to the submount; and
    a lens overlying the submount.

22. The device of claim 21 further comprising:
    a heat sink disposed between the leads and the submount.

23. The device of claim 1 wherein the fit and second contacts comprise aluminum.

24. The device of claim 1 wherein at least one of the first and second contacts comprises a multilayer contact.

25. The device of claim 24 wherein the multilayer contact comprises a first layer of aluminum and a second layer overlying the first layer, the second layer comprising a material selected from a group consisting of Al—Si, Al—Si—Ti, Al—Cu, and Al—Cu—W.

26. A III-nitride light emitting device comprising:
    a first layer of first conductivity type;
    a first layer of second conductivity type;
    an active region;
    a tunnel junction, the tunnel junction comprising:
        a second layer of first conductivity type having a dopant concentration greater than the first layer of fist conductivity type; and
        a second layer of second conductivity type having a dopant concentration greater than the first layer of second conductivity type; and
    a textured layer overlying the tunnel junction;
    wherein the active region is disposed between a layer of first conductivity type and a layer of second conductivity tye.

27. The device of claim 26 further comprising:
a first contact electrically connected to the first layer of first conductivity type; and
a second contact electrically connected to the textured layer.

28. The device of claim 27 wherein a surface of the second contact adjacent to the textured layer is substantially flat, the device further comprising at least one void disposed between the textured layer and the second contact.

29. The device of claim 28 wherein the void is filled with air.

30. The device of claim 26 further comprising a polarization selection layer.

31. The device of claim 30 further comprising a substrate having a first surface and a second surface opposite the first surface, wherein the first layer of first conductivity type overlies the first surface and the polarization selection layer is disposed on the second surface.

32. The device of claim 30 wherein the polarization selection layer comprises a wire grid polarizer.

33. The device of claim 26 further comprising:
a submount;
a first interconnect connecting the first contact to the submount; and
a second interconnect connecting the second contact to the submount.

34. The device of claim 33 further comprising:
a plurality of leads connected to the submount; and
a lens overlying the submount.

35. The device of claim 34 further comprising:
a heat sink disposed between the leads and the submount.

36. The device of claim 26 wherein the textured layer comprises islands of semiconductor material and pockets.

37. The device of claim 36 wherein the islands of semiconductor material comprise about 10% to about 90% of a volume of the textured layer.

38. The device of claim 36 wherein the islands of semiconductor material comprise about 10% to about 50% of a volume of the textured layer.

39. The device of claim 36 wherein the pockets are filled with air.

40. The device of claim 36 wherein the pockets are at least partially filled with a material having an index of redaction less than about 2.

41. The device of claim 36 wherein the second contact is formed over the textured layer and fills the pockets.

42. The device of claim 26 wherein the textured layer has a thickness between about 200 Å and about 10,000 Å.

43. The device of claim 26 wherein the textured layer has a thickness between about 500 Å and about 4000 Å.

44. A III-nitride light emitting device comprising:
a substrate having a first surface and a second surface opposite the first surface;
a layer of first conductivity type formed on the first surface;
a layer of second conductivity type;
an active region disposed between the layer of first conductivity type and the layer of second conductivity type; and
a textured layer formed on the second surface.

45. The device of claim 44 wherein the substrate is SiC.

46. The device of claim 44 wherein the textured layer comprises islands of semiconductor material and pockets.

47. The device of claim 46 wherein the islands of semiconductor material comprise about 10% to about 90% of a volume of the textured layer.

48. The device of claim 46 wherein the islands of semiconductor material comprise about 10% to about 50% of a volume of the textured layer.

49. The device of claim 44 wherein the textured layer has a thickness between about 200 Å and about 10,000 Å.

50. The device of claim 44 wherein the textured layer has a thickness between about 500 Å and about 4000 Å.

* * * * *